(12) United States Patent
Tsurumaru et al.

(10) Patent No.: US 6,446,863 B1
(45) Date of Patent: Sep. 10, 2002

(54) ELECTRONIC APPARATUS WITH A CARD DETACHABLY INSERTED

(75) Inventors: Shinichiro Tsurumaru; Fumio Mishina, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/539,869

(22) Filed: Mar. 31, 2000

(30) Foreign Application Priority Data

Jul. 9, 1999 (JP) .......................................... 11-195752

(51) Int. Cl.⁷ ................................................ G06K 5/00
(52) U.S. Cl. ....................... 235/380; 235/441; 439/638; 439/639; 439/653
(58) Field of Search ................................ 235/380, 441; 439/639, 638, 653

(56) References Cited

U.S. PATENT DOCUMENTS

| | | | | |
|---|---|---|---|---|
| 5,538,437 A | * | 7/1996 | Bates, III et al. ............ | 439/352 |
| 5,683,264 A | * | 11/1997 | Hobgood et al. ............ | 439/352 |
| 5,752,857 A | * | 5/1998 | Knights ...................... | 439/638 |
| 5,820,414 A | * | 10/1998 | Omori ........................ | 439/638 |
| 6,149,450 A | * | 11/2000 | Gastineau ................... | 439/325 |

* cited by examiner

*Primary Examiner*—Karl D. Frech
*Assistant Examiner*—Seung H. Lee
(74) *Attorney, Agent, or Firm*—Staas & Halsey LLP (57) ABSTRACT

An electronic apparatus has an apparatus body into which one of first and second, different kinds of cards can selectively be inserted. The positions of connecting terminals of the first and second cards are different from each other. When one of the cards is inserted into said apparatus body, an electrical communication between the card and the apparatus body can be attained. The apparatus includes an apparatus body having connecting sections and an adapter which comprises a base portion, a connector member accommodated in the base portion for connecting the connecting terminals of the card to the connections sections of the apparatus body, and a unit for holding the connector member selectively at either one of two positions, in the base portion, in accordance with the kind of card.

10 Claims, 7 Drawing Sheets

ELECTRONIC APPARATUS WITH A CARD DETACHABLY INSERTED

BACKGROUND OF THE INVENTION

1. Field of the Invention

The present invention relates to an electronic apparatus to which different kinds of cards can be selectively inserted, such as a portable wireless control apparatus accommodating therein two kinds of wireless PC cards, for example, which can be selectively and detachably inserted into the apparatus. More particularly, this invention relates to an electrical connection between such a card and an apparatus body.

It has been required that a portable wireless control apparatus accommodating a wireless card is small in size and light in weight. Therefore, the card must be accommodated in a small space in the apparatus body. In addition, in order to widen the market of these wireless apparatus, it has become necessary that the apparatus itself can be applied to any other type of wireless card.

2. Description of the Related Art

Figure 7:
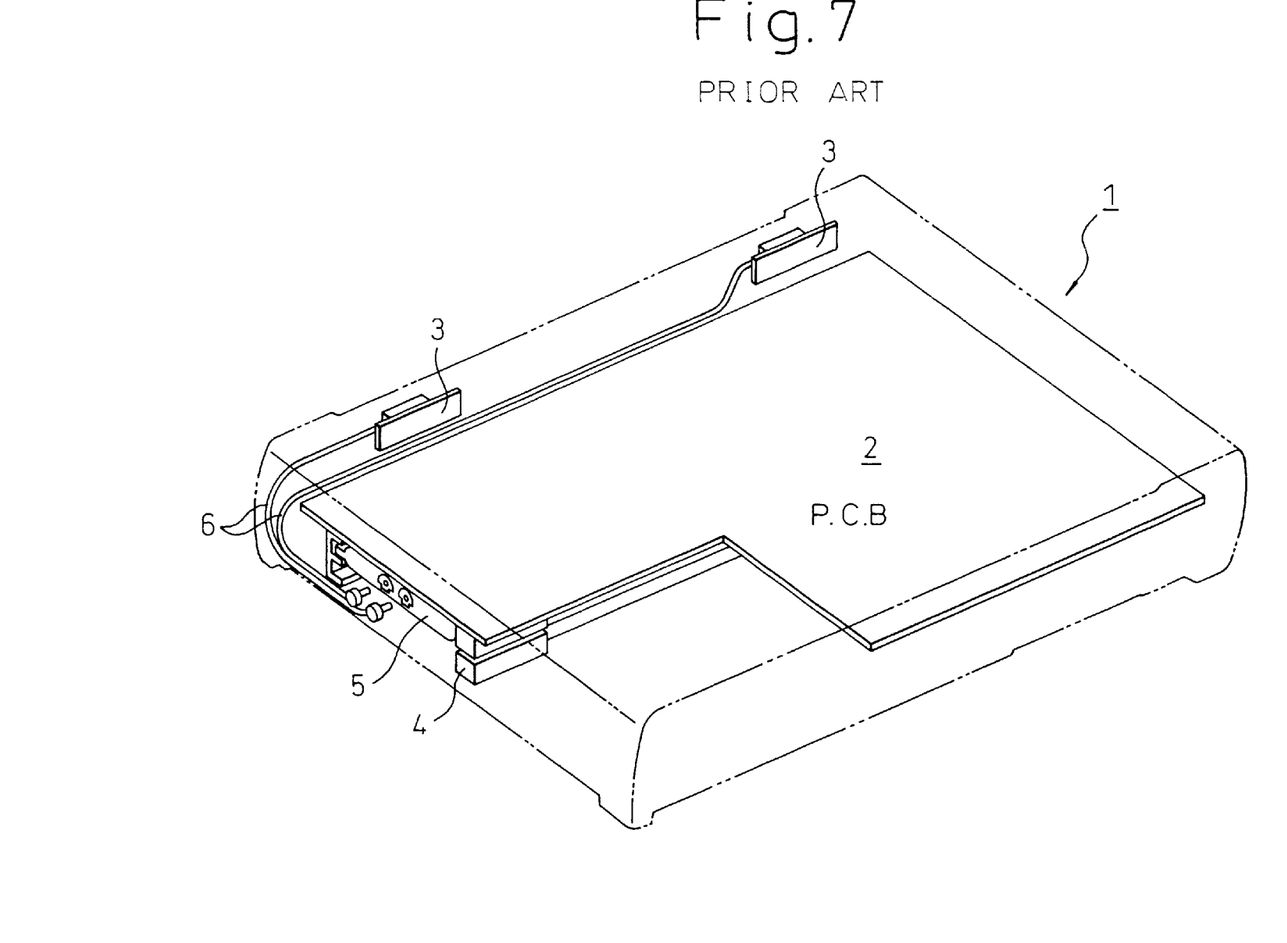
FIG. 7 is a perspective view showing the overall portable wireless apparatus known in the prior art.
Figure 8:
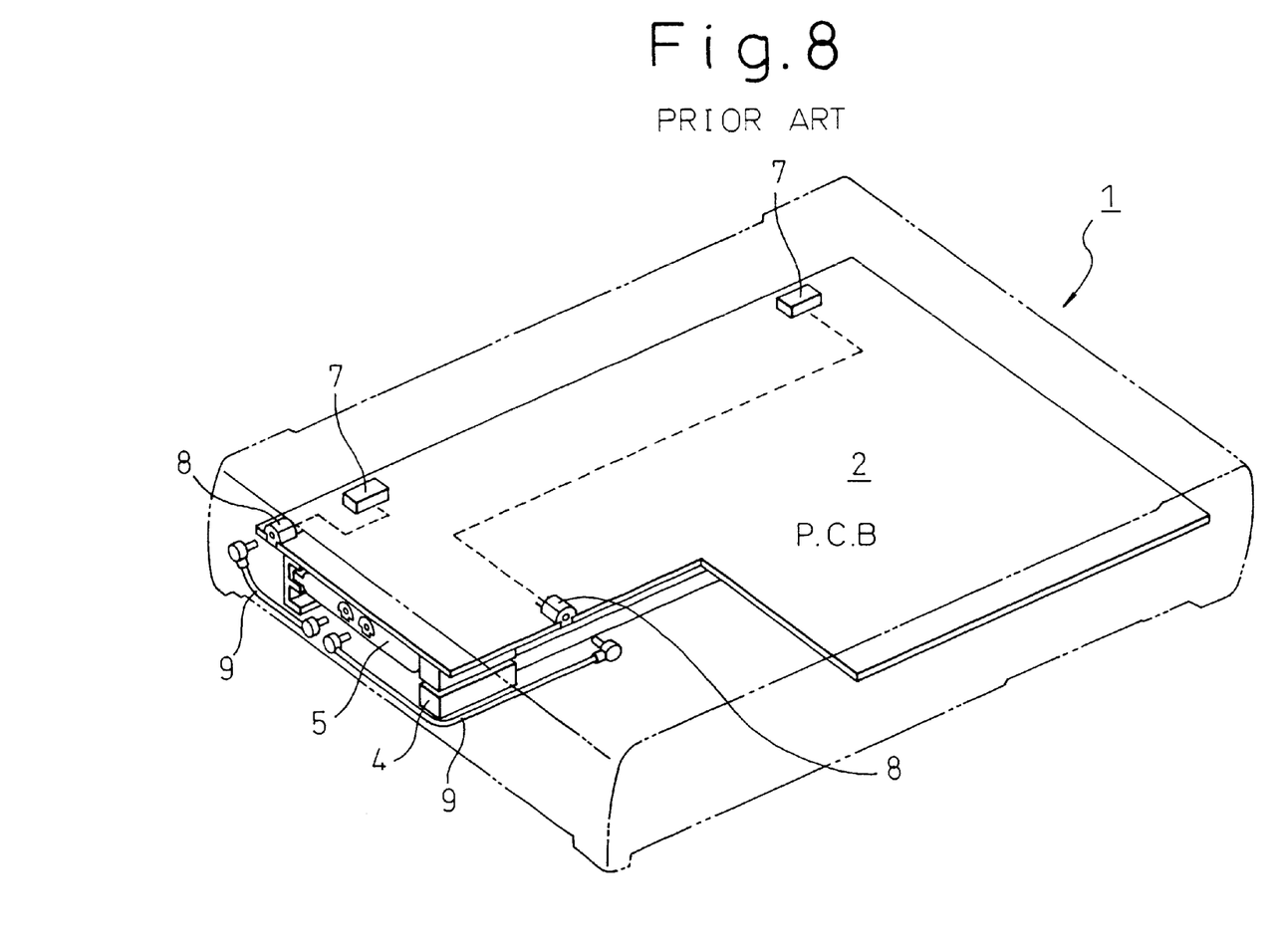
FIG. 8 is a perspective view showing another portable wireless apparatus known in the prior art.

With reference to FIGS. 7 and 8, a conventional wireless apparatus will be described. In FIG. 7, reference numeral 1 denotes a body of a wireless apparatus; 2 denotes a printed circuit board arranged in the apparatus body; 3 denotes two wireless units (antennas) arranged in the vicinity of the side wall of the apparatus body; 4 denotes a connector (PCMCIA connector) for setting the wireless card to the apparatus body; 5 denotes a wireless card detachably fitted into the apparatus body; 6 denotes a coaxial cable for electrically connecting the wireless unit to the wireless card.

In this prior art, two wireless units 3 are arranged in the apparatus, but in the vicinity of the outer wall thereof. The coaxial cables 6 extend from the respective wireless units 3 to a position in front of the wireless card 5 and the tip end plugs of these coaxial cables 6 are inserted into the two slots (jacks), respectively, provided at the front side of the wireless card 5, so that the signal can be communicated between the antennas 3 and the wireless card 5.

In the prior art shown in FIG. 8, the two wireless chips (antennas) 7 are mounted on the printed circuit board 2 and connected to the two slots 8, respectively, provided in the vicinity of the card inserting section of the printed circuit board 2 by means of the lines on the printed circuit board 2, respectively. The end plugs of the two cables 9 are connected, at one end thereof, to the slots 8 on the printed circuit board 2 and, at the other end thereof, to the slots of the wireless card 5, so that the signal can be communicated between the antennas 3 and the wireless card 5.

As shown in FIGS. 7 and 8, in the prior art method of the connection between the antennas and the wireless card, coaxial cables are used because noise would be picked-up if general type cables were used. Thus, it would be necessary to provide a space to place the coaxial cables therealong and to prevent the coaxial cables from affecting the other electronic parts. In addition, the coaxial cables may be damaged by the operator himself when the operator touches the cables.

SUMMARY OF THE INVENTION

An object of the present invention is to provide an electric apparatus to which different kind of cards can selectively be inserted, capable of improving the connecting operation without cables, connecting in a small space, and avoiding problems of breakage of cables, without using cables for the electrical or signal connection between the card and the apparatus body.

According to the present invention, there is provided an electronic apparatus with a card detachably inserted thereinto, the apparatus comprising: a circuit board on which a connector is provided; a card slot section into which a card having a connector can be inserted; an adapter for electrically connecting the connector of the card to the connector of the circuit board, the adapter comprising: an integrally formed connector provided with a first connector portion being in contact with the connector of the circuit board and a second connector portion with which the connector of the card comes in contact; and a base portion for accommodating therein the integrally formed connector in such a manner that a position of the second connector portion can be changed.

The adapter comprises two integrally formed connectors which can be accommodated in the base portion in such a manner that a distance between two second connector portions can be changed.

According to another aspect of the present invention, there is provided an electronic apparatus with a card detachably inserted thereinto, capable of selectively accepting into an apparatus body either one of at least two kinds of cards, whose connecting terminals positions are different from each other, and capable of attaining an electrical communication between the card and the apparatus body, when the card is fitted in the apparatus body; the apparatus comprising:

the apparatus body having connecting sections; and an adapter comprising a base portion, a connector means accommodated in the base portion for connecting the connecting terminals of the card to the connecting sections of the apparatus body, and means for holding the connector means selectively at either one of at least two positions in the base portion in accordance with the kind of card.

The card has two slots as the connecting terminals and the apparatus body also has two slots as the connecting sections, and the distance between the first slot of the apparatus body and the first slot of the card is equal to a distance between the second slot of the apparatus body and the second slot of the card, when the card is inserted into the apparatus body.

One of a first card and a second card can selectively be inserted into the apparatus body, each of first and second cards having two slots, but the distance between the two slots being different from each other, a sum of an interval between the two slots of the first card and an interval between the two slots of the second card being equal to an interval between the two slots of the apparatus body.

The two slots of the first and second cards and the two slots of the apparatus body are symmetrically arranged with respect to a reference surface perpendicular to the cards.

According to still another aspect of the present invention, there is provided an electronic apparatus comprising:

an apparatus body comprising, a receiving section to which either one of first and second electronic units can selectively fitted, the first electronic unit having a first connecting terminal at a first position and the second electronic unit having a second connecting terminal at a second position different from the first position; and a body side connecting terminal to which one of the first and second connecting terminals is selectively connected for electrical communication, when one of the first and second electronic units is fitted into the receiving section;

an adapter accommodating therein a pair of connectors, which can be inserted into the first or second connecting terminal and the body side connecting terminal, respectively; and the body side connecting terminal being arranged in such a manner that an interval between the first connecting terminal and the body side connecting terminal in a state where the first electronic unit is fitted into the apparatus body is equal to an interval between the second connecting terminal and the body side connecting terminal in a state where the second electronic unit is fitted into the apparatus body.

According to still another aspect of the present invention, there is provided a connecting adapter for connecting a connecting terminal of a first electronic unit and a connecting terminal of a second electronic unit, the adapter comprising:

a connector comprising a first connector portion electrically connected to the connecting terminal of the first electronic unit and a second connector portion electrically connected to the connecting terminal of the second electronic unit, the first and second connector portions being integrally formed together;

a cover for accommodating therein the connector, the cover having one or more first slots into which the first connector portion can be inserted and a plurality of second slots into which the second connector portion can be inserted, a number of the first slots being the same as the number of the connector and a number of the second slots being more than the number of the connector, so that the connectors are accommodated in the cover in such a manner that the first connector portions are located in the respective first slots and the second connector portions can selectively be located in the second slots.

Otherwise, respective numbers of the first and second slots are more than the number of the connectors, so that the connectors are accommodated in the cover in such a manner that the first and second connector portions can selectively be located in the first and second slots, respectively.

DETAILED DESCRIPTION OF THE EMBODIMENTS

Figure 1:
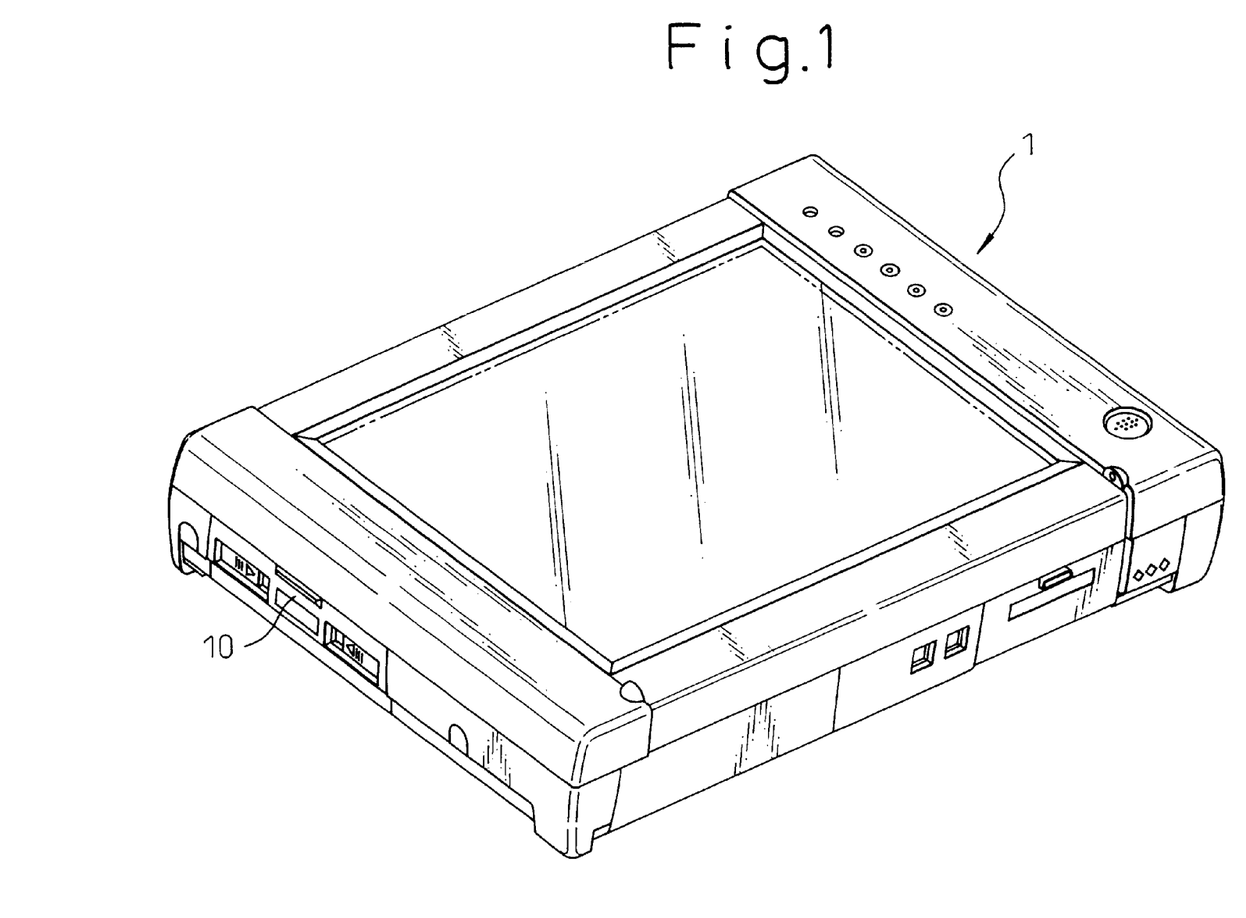
FIG. 1 is a perspective view showing the overall portable wireless apparatus according to the present invention.
Figure 2:
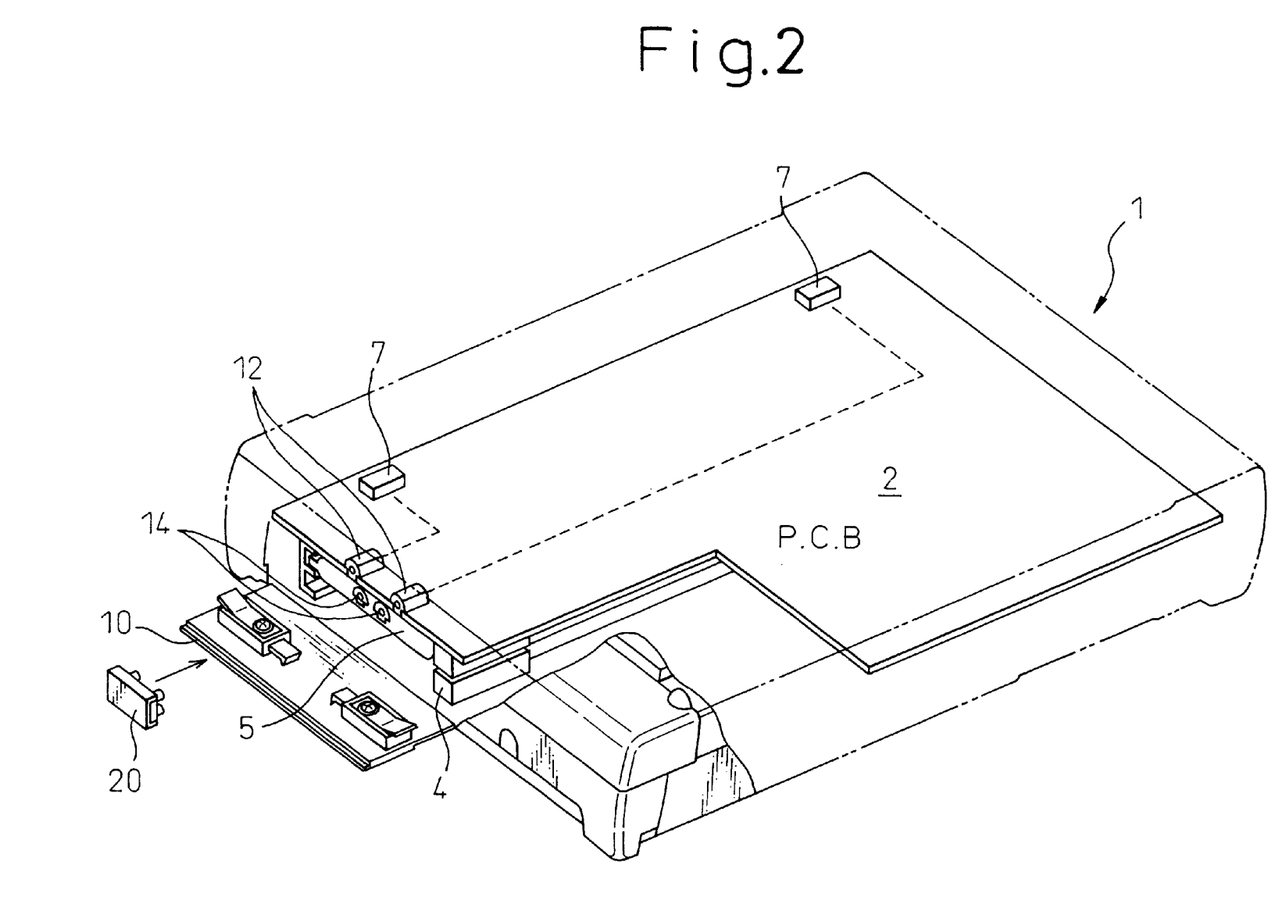
FIG. 2 is a perspective view showing the overall portable wireless apparatus so that a printed circuit board can be seen and a state in which a lid for the card inserting slot is opened.

Referring to the drawings, wherein FIGS. 1 and 2 represent a portable wireless apparatus according to the present invention, in which FIG. 1 is a perspective view showing the overall structure thereof and FIG. 2 shows a printed circuit board used in the apparatus, reference numeral 1 denotes a body of the wireless apparatus; 2 denotes a printed circuit board accommodated in the apparatus body; 5 denotes a wireless card; 7 denotes wireless chips (antennas) mounted on the printed board; 10 denotes a lid for opening and closing the wireless card inserting hole; and 20 denotes a connecting adapter. Two wireless chips 7 are mounted on the printed circuit board 2 at positions in the vicinity of the side surface of the apparatus body and relatively far from each other so as to improve the efficiency of the antenna. These two wireless chips 7 are electrically connected to two connector terminals (slots) 12, respectively, arranged on the circuit board 2 at positions in the vicinity of the card inserting section by means of lines (shown by broken lines) on the printed circuit board 2. These two slots 12 are arranged at predetermined position with respect to each other.

The wireless card 5 can be accommodated in the apparatus body 1 by opening the lid 10 of the card inserting slot of the apparatus body 1 and inserting it into the connector (PCMCIA connector). For this purpose, the wireless card 5 has two connecting terminals (connecting slots) 14 on a rear wall thereof perpendicular to the inserting direction of the wireless card 5. These two slots 14 are also arranged in such a manner that they are in parallel to the two slots 12 provided on the printed circuit board 2 of the apparatus body.

The two slots 14 of the wireless card 5 are connected to the two slots 12 of the apparatus body, respectively, by means of a connecting adapter 20, which will be described later in detail, so that the wireless chips 7 (the printed circuit board 2) and the wireless card 5 can be electrically connected to each other and thus a signal connection therebetween can be attained. After the connecting adapter 20 is connected, the lid 10 is closed and thus an usual operating condition of this wireless apparatus can be attained.

Figure 3:
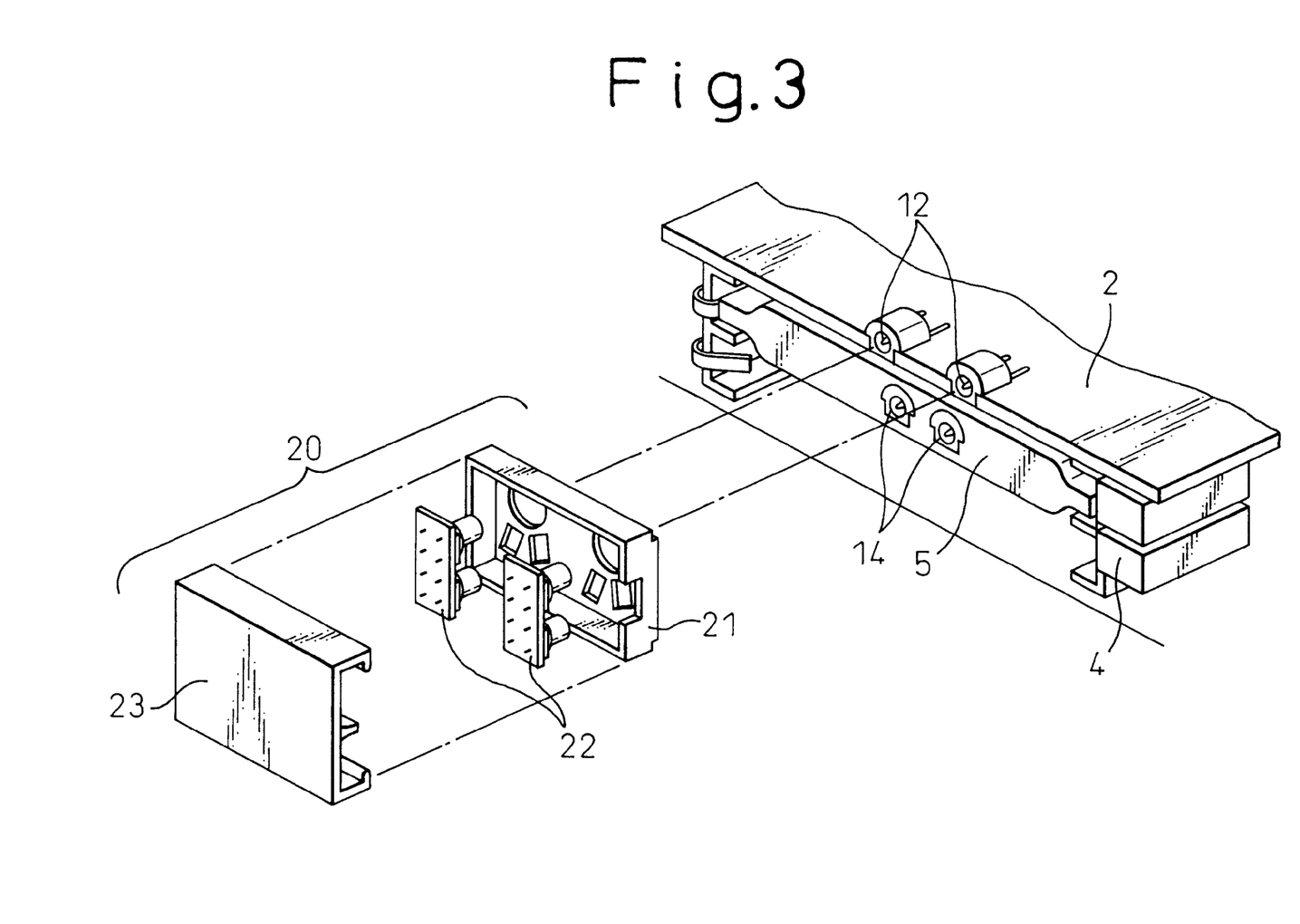
FIG. 3 is an exploded perspective view of the wireless card which is mounted on the body and an exploded perspective view of the connecting adapter.
Figure 4:
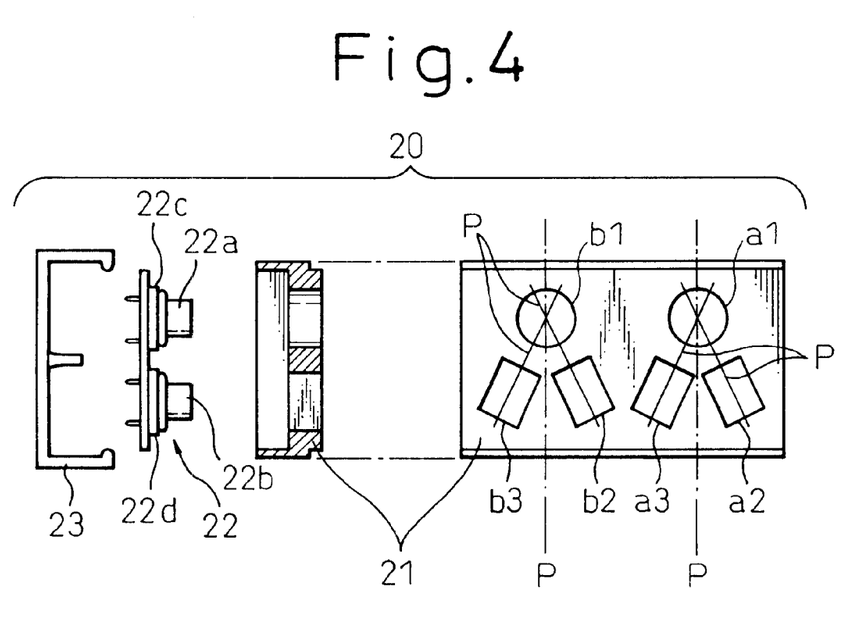
FIG. 4 is an exploded perspective view of the connecting adapter and a plan view of the base portion.
Figure 5:
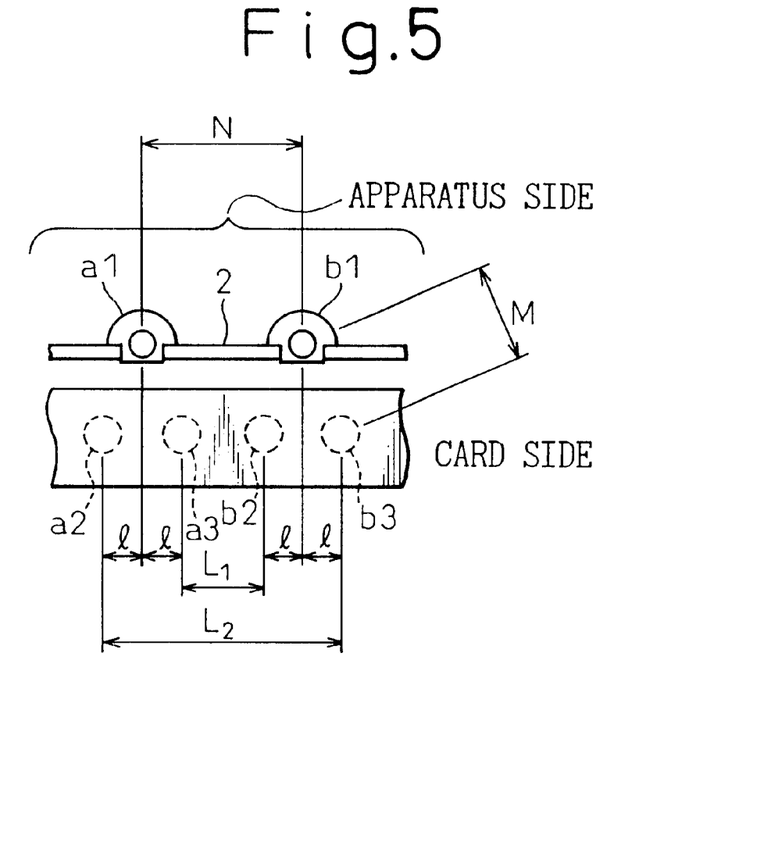
FIG. 5 is a view showing the relationship between the connecting slots of the apparatus body and the connecting slots of the card.
Figure 6:
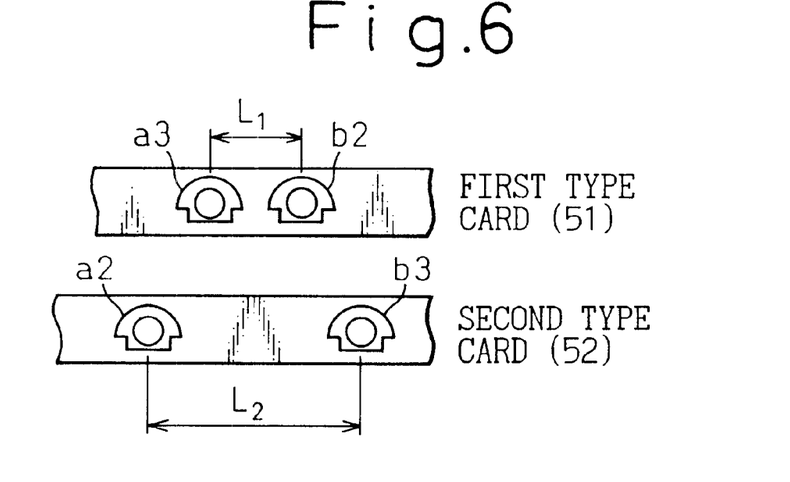
FIG. 6 is a view showing the relationship between the connecting slots for the two kinds of wireless card.

FIG. 3 shows a state in which the wireless card 5 is mounted on the body and also shows the connecting adapter 20 in an exploded perspective view. FIG. 4 shows the connecting adapter 20 in an exploded perspective view. FIG. 5 illustrates the relationship in positions between the connecting slots of the apparatus body and the connecting slots of the card. FIG. 6 shows the relationship in position between the connecting slots for the two kinds of wireless card.

For an example, a case wherein two kinds of cards can selectively be used will now be explained. In this case, the two kinds of cards have the same size and the same thickness, but the intervals between two connectors are different from each other. More specifically, as shown in FIG. 6, the first type card 51 has a connector interval of $L_1$ which is shorter than a connector interval of $L_2$ of the second type card 52. At present, no standard with respect to the connector position of these kinds of card has been settled. Therefore, a situation wherein these two kinds of cards may be simultaneously used will continue in the future.

It should be one of the solutions that different types of adapters are prepared so as to apply them individually to the respective of these types of card. However, such a solution will require a lot of parts and there is a possibility that another type of adapter is wasted. Thus, according to the present invention, a connecting adapter which can be applied to both types of cards is provided.

For the purpose of attaining this object, according to the present invention, the connectors of the printed circuit board are arranged in such a manner that a distance thereto from the connectors of the first type of card and a distance thereto from the connectors of the second type of card are the same.

In FIG. 5, the two connecting slots 12 at the side of the apparatus body are provided on the printed circuit board 2. The relationship in position between these two connecting slots 12 and the two connecting slots 14 at the side of the wireless card 5 is as follows. The interval M between the position (a1) of one of the slots 12 at the side of the apparatus body and the positions (a2), (a3) of one of the two slots 14 at the side of the wireless card is the same as the distance M between the position (b1) of the other slot 12 at the side of the apparatus body and the positions (b2), (b3) of the other slot 14 at the side of the wireless card.

As mentioned above, there are two kinds of wireless cards 5 which can be selectively inserted into this portable wireless electronic apparatus. The first type card, i.e., the wireless card 51, and the second type card, i.e., the wireless card 52 have the respective intervals L1 and L2 between the two slots which are different from each other. Half of the sum of the slot interval L1 of the first type wireless card 51 and the slot interval L2 of the second type wireless card 52 is equal to the interval N of the two slots at the side of the apparatus body.

In FIGS. 5 and 6, it is presumed that distances in the horizontal direction only are considered. The position a1 of one of the slots 12 at the apparatus body side is located at a central position between the position a3 of one of the slots 51 of the first type wireless card 51 and the position a2 of one of the slots 52 of the second type wireless card 52. In addition, the position b1 of the other slot 12 at the apparatus body side is located at a central position between the position b2 of the other slot of the first type wireless card 51 and the position b3 of the other slot of the second type wireless card 52.

Therefore, in other words, in a state in which the card is in inserted condition, as shown in FIG. 5, the position a3 of the one of the slot 12 of the first type wireless card 51 and the position a2 of the one of the slot of the second type wireless card 52 are located at predetermined positions of the same distance M from the position a1 of one of the slots at the apparatus body side. In addition, the position b2 of the other slot 12 of the first type wireless card 51 and the position b1 of the other slot of the second type wireless card 52 are located at predetermined positions of the same distance M from the position b1 of the other slot at the apparatus body side.

As mentioned above, the apparatus body is provided with connecting slots at positions corresponding to the positions of the connecting slots of the two kinds of wireless cards. Therefore, the connecting adapter can be constituted as follows.

As shown in FIGS. 3 and 4, the connecting adapter 20 comprises a base portion 21 made of insulating material, such as resin, two connectors 22 made of metal conducting material, and a cover made of resin. The two connectors 22 have the same size and same shape. Each of the connectors 22 is provided at one end thereof with a projected portion 22a to be fitted with the connecting slot (a1, b1) of the apparatus body and, at the other end with a projected portion 22b to be fitted with the connecting slots (a2, a3; b2, b3) of card.

The base 21 is provided at the upper portion thereof with two circular holes a1, b1 (FIG. 4) which receive the projected portions 22a provided at one end of the two connectors and at the lower portion thereof with respective two rectangular holes, a total of four holes a2, a3; b2, b3 (FIG. 4), which selectively receive projected portion 22b provided at the other end of the two connectors. The upper two holes are arranged so as to correspond to the two connecting slots a1, b1 (FIG. 5) of the apparatus body and the lower four holes are arranged so as to correspond to the respective connecting slots a2, a3; b2, b3 of the card 51 and card 52 (FIGS. 5 and 6).

The respective connector 22 is provided, at the base portion of the projection which can fit with the connecting slot of the apparatus body, with a circular portion 22c, and is provided, at the base portion of the projection which can be fit with the connecting slot of the card, with a rectangular portion 22d. When the respective connector 22 is fitted with the base portion 21 of the connecting adapter 20, the circular portion 22c of the connector 22 is fitted with the circular hole a1, b1 (FIG. 4) of the base portion, and the rectangular portion 22d of the connector 22 is fitted with the rectangular holes a2, a3; b2, b3 (FIG. 4) of the base portion 21. After the connector 22 is fitted with the base portion 21, the cover 23 is pushed toward the base portion 21. Thus, the connector 22 is fixed to the base 21 and the connecting adapter 22 is assembled.

The base portion 21 and the cover 23 of the connecting adapter 20 are made of a suitable resin. The cover 23 can be fixed to the base portion 21 by fitting the former with the latter with a snap-spring and also can be removed therefrom by resiliently widening the cover 23. As shown in FIG. 4, the rectangular holes of the base portion 21 are symmetrically arranged with respect to the vertical lines P passing through the central point of the circular holes. Therefore, the projection 22 at one end of the connector 22 is always inserted into the circular hole and, moreover, the projection at the other end of the connector 22 is selectively inserted either one of two rectangular holes in accordance with the kind of the wireless card. Thus, the connector is positioned and, therefore, a miss fitting or reverse fitting can be prevented.

After the connecting adapter 20 is assembled as mentioned above, the connecting adapter 20 can be attached to the apparatus body by a single touch and an electrical connection can be attained by inserting the projections 22a and 22b into the slots (a1, b1) of the apparatus body and the slots (a2, a3; b2, b3), respectively.

It should be understood by those skilled in the art that the foregoing description relates to only a preferred embodiment of the disclosed invention, and that various changes and modifications may be made to the invention without departing from the spirit and scope thereof.

What is claimed is:

1. An electronic apparatus into which a card is detachably insertable, said apparatus comprising:

a circuit board on which a connector is provided;

a card slot section into which a card having a connector can be inserted;

an adapter for electrically connecting said connector of the card to said connector of the circuit board, said adapter comprising:

an integrally formed connector provided with a first connector portion in contact with said connector of the circuit board and a second connector portion with which said connector of the card comes in contact, and a base portion for accommodating therein said integrally formed connector in such a manner that a position of said second connector portion can be changed.

2. An electronic apparatus as set forth in claim 1, wherein said adapter comprises two integrally formed connectors which can be accommodated in said base portion in such a manner that a distance between two second connector portions can be changed.

3. An electronic apparatus into which a card is detachably insertable, said electronic apparatus comprising:
- an apparatus body having connecting sections and being capable of selectively accepting therein either one of at least two kinds of cards, whose respective positions of connecting terminals are different from each other, and capable of attaining an electrical communication between a card and said apparatus body when the card is fitted to said apparatus body and
- an adapter comprising a base portion, a connector means accommodated in said base portion for connecting said connecting terminals of the card to said connecting sections of the apparatus body, and means for holding said connector means selectively at either one of at least two positions in said base portion in accordance with the kind of card.

4. An apparatus as set forth in claim 3, wherein said card has two slots as said connecting terminals and said apparatus body also has two slots as said connecting sections, and a distance between the first slot of the apparatus body and the first slot of the card is equal to a distance between the second slot of the apparatus body and the second slot of the card, when the card is inserted into said apparatus body.

5. An apparatus as set forth in claim 4, wherein one of a first card and a second card can selectively be inserted into said apparatus body, each of first and second cards having two slots, but the distances between the two slots being different form each other, a half of the sum of an interval between the two slots of the first card and an interval between the two slots of the second card being equal to an interval between the two slots of the apparatus body.

6. An apparatus as set forth in claim 5, wherein said two slots of the first and second cards and said two slots of the apparatus body are symmetrically arranged with respect to a reference surface perpendicular to said cards.

7. An electronic apparatus, comprising:
- an apparatus body, comprising:
  - a receiving section to which either one of first and second electronic units can selectively be fitted, said first electronic unit having a first connecting terminal at a first position and said second electronic unit having a second connecting terminal at a second position different from said first position, and
  - a body side connecting terminal to which one of said first and second connecting terminals is selectively connected for electrical communication, when one of said first and second electronic units is fitted into said receiving section;
- an adapter accommodating therein a pair of connectors insertable into said first or second connecting terminal and said body side connecting terminal, respectively; and
- said body side connecting terminal being arranged in such a manner that an interval between the first connecting terminal and the body side connecting terminal, in a state where said first electronic unit is fitted into said apparatus body, is equal to an interval between the second connecting terminal, and the body side connecting terminal, in a state where said second electronic unit is fitted into said apparatus body.

8. A connecting adapter for connecting a connecting terminal of a first electronic unit and a connecting terminal of a second electronic unit, said connecting adapter comprising:
- a connector comprising a first connector portion electrically connected to the connecting terminal of said first electronic unit and a second connector portion electrically connected to the connecting terminal of said second electronic unit, said first and second connector portions being integrally formed together; and
- a cover accommodating therein said connector, said cover having first slots into which said first connector portion can be inserted and second slots into which said second connector portion can be inserted, a number of said first slots being the same as the number of said connector and a number of said second slots being more than the number of said connector.

9. A connecting adapter for connecting a connecting terminal of a first electronic unit and a connecting terminal of a second electronic unit, said connecting adapter comprising:
- a number of connectors each comprising a first connector portion electrically connected to the connecting terminal of said first electronic unit and a second connector portion electrically connected to the connecting terminal of said second electronic unit, said first and second connector portions being integrally formed together;
- a cover having a plurality of first slots into which said first connector portions can be inserted and a plurality of second slots into which said second connector portions can be inserted; and
- a number of said first slots being the same as the number of said connectors and a number of said second slots being more than the number of said connectors, so that said connectors are accommodated in said cover in such a manner that said first connector portions are located in said respective first slots and said second connector portions can selectively be located in said second slots.

10. A connecting adapter for connecting a connecting terminal of a first electronic unit and a connecting terminal of a second electronic unit, said adapter comprising:
- a number of connectors each comprising a first connector portion electrically connected to the connecting terminal of said first electronic unit and a second connector portion electrically connected to the connecting terminal of said second electronic unit, said first and second connector portions being integrally formed together;
- a cover having a plurality of first slots into which said first connector portions can be inserted and a plurality of second slots into which said second connector portions can be inserted; and
- respective numbers of said first and second slots each being more than the number of said connectors, so that said connectors are accommodated in said cover in such a manner that said first and second connector portions can selectively be located in said first and second slots, respectively.

* * * * *